(12) United States Patent
Du et al.

(10) Patent No.: US 10,240,231 B2
(45) Date of Patent: Mar. 26, 2019

(54) CHEMICAL VAPOR DEPOSITION APPARATUS AND ITS CLEANING METHOD

(71) Applicant: Advanced Micro-Fabrication Equipment Inc. Shanghai, Shanghai (CN)

(72) Inventors: Zhiyou Du, Shanghai (CN); Peijin Xing, Shanghai (CN); Wenyuan Fan, Shanghai (CN); Yinxin Jiang, Shanghai (CN)

(73) Assignee: ADVANCED MICRO-FABRICATION EQUIPMENT INC, SHANGHAI, Shanghai (CN)

( * ) Notice: Subject to any disclaimer, the term of this patent is extended or adjusted under 35 U.S.C. 154(b) by 361 days.

(21) Appl. No.: 15/139,156

(22) Filed: Apr. 26, 2016

(65) Prior Publication Data
US 2016/0319425 A1    Nov. 3, 2016

(30) Foreign Application Priority Data

Apr. 30, 2015 (CN) .......................... 2015 1 0218357

(51) Int. Cl.
    *C23C 16/44* (2006.01)
(52) U.S. Cl.
    CPC ...... *C23C 16/4412* (2013.01); *C23C 16/4407* (2013.01)
(58) Field of Classification Search
    USPC ...................................... 118/715; 156/345.29
    See application file for complete search history.

(56) References Cited

U.S. PATENT DOCUMENTS

| 5,383,984 | A | * | 1/1995 | Shimada | H01J 37/32522 118/723 ER |
| 5,788,799 | A | * | 8/1998 | Steger | B08B 7/0042 134/1.1 |
| 5,884,009 | A | * | 3/1999 | Okase | H01L 21/67017 219/405 |
| 5,891,251 | A | * | 4/1999 | MacLeish | C23C 16/0227 118/719 |
| 5,891,350 | A | * | 4/1999 | Shan | H01J 37/32477 118/723 E |
| 5,922,133 | A | * | 7/1999 | Tepman | C23C 14/50 118/503 |
| 6,261,408 | B1 | * | 7/2001 | Schneider | C23C 16/4412 118/715 |
| 6,296,747 | B1 | * | 10/2001 | Tanaka | C23C 14/345 204/298.07 |

(Continued)

*Primary Examiner* — Rudy Zervigon
(74) *Attorney, Agent, or Firm* — Womble Bond Dickinson (US) LLP; Joseph Bach, Esq.

(57) ABSTRACT

A chemical vapor deposition apparatus includes: a reaction chamber, a reaction area in the upper portion of the reaction chamber, an exhaust area in the bottom portion of the reaction chamber and a pumping apparatus connected to the outside of the reaction chamber. The exhaust area includes an isolating device dividing the exhaust area into an exhaust chamber and a storage chamber. The isolating device has a sidewall with gas openings connecting the exhaust chamber and the storage chamber. The exhaust area further includes a scraping component that can move up and down between the upper end and the lower end of the gas openings.

16 Claims, 7 Drawing Sheets

(56) References Cited

U.S. PATENT DOCUMENTS

| | | | | |
|---|---|---|---|---|
| 6,408,786 B1* | 6/2002 | Kennedy | C23C 16/4404 | 118/723 AN |
| 6,527,911 B1* | 3/2003 | Yen | H01J 37/32568 | 118/723 E |
| 6,531,069 B1* | 3/2003 | Srivastava | H01J 37/3244 | 118/723 R |
| 6,821,180 B2* | 11/2004 | Kimura | H01J 9/027 | 445/5 |
| 7,009,281 B2* | 3/2006 | Bailey, III | H01J 37/32522 | 156/345.24 |
| 7,011,039 B1* | 3/2006 | Mohn | H01J 37/321 | 118/723 R |
| 7,048,837 B2* | 5/2006 | Somekh | C23C 14/046 | 204/192.13 |
| 7,332,038 B2* | 2/2008 | Jurgensen | C23C 16/4412 | 118/715 |
| 7,987,814 B2* | 8/2011 | Carducci | H01J 37/32082 | 118/723 R |
| 7,988,815 B2* | 8/2011 | Rauf | H01J 37/16 | 118/723 E |
| 7,993,457 B1* | 8/2011 | Krotov | C23C 16/45544 | 118/719 |
| 8,118,938 B2* | 2/2012 | Carducci | H01J 37/32082 | 118/715 |
| 8,142,567 B2* | 3/2012 | Kobayashi | C23C 16/4412 | 118/715 |
| 8,506,713 B2* | 8/2013 | Takagi | C23C 16/409 | 118/715 |
| 8,580,092 B2* | 11/2013 | Hawrylchak | C23C 14/564 | 204/298.11 |
| 8,597,462 B2* | 12/2013 | Brown | H01J 37/32495 | 118/715 |
| 8,617,347 B2* | 12/2013 | Kim | C23C 16/4412 | 118/715 |
| 8,790,489 B2* | 7/2014 | Honda | H01J 37/18 | 118/715 |
| 8,815,711 B2* | 8/2014 | Suzuki | B08B 17/02 | 257/E21.101 |
| 8,840,725 B2* | 9/2014 | Palagashvili | H01J 37/32091 | 118/715 |
| 8,852,386 B2* | 10/2014 | Iizuka | H01J 37/32834 | 156/345.33 |
| 8,920,564 B2* | 12/2014 | Tzu | C23C 16/4412 | 118/724 |
| 9,388,493 B2* | 7/2016 | Chang | C23C 16/4407 | |
| 9,567,669 B2* | 2/2017 | Cho | C23C 16/4412 | |
| 9,779,918 B2* | 10/2017 | Lee | H01J 37/32834 | |
| 9,852,905 B2* | 12/2017 | Sung | C23C 16/45502 | |
| 9,909,213 B2* | 3/2018 | Shoji | H01J 37/32633 | |
| 9,938,621 B2* | 4/2018 | Mitrovic | C23C 16/45504 | |
| 2003/0000647 A1* | 1/2003 | Yudovsky | C23C 16/4585 | 156/345.51 |
| 2003/0037880 A1* | 2/2003 | Carducci | H01J 37/32522 | 156/345.43 |
| 2006/0000552 A1* | 1/2006 | Tanaka | B08B 7/0035 | 156/345.28 |
| 2006/0105575 A1* | 5/2006 | Bailey, III | H01J 37/32522 | 438/706 |
| 2006/0196604 A1* | 9/2006 | Moriya | C23F 4/00 | 156/345.34 |
| 2006/0213439 A1* | 9/2006 | Ishizaka | C23C 16/4401 | 118/715 |
| 2006/0272561 A1* | 12/2006 | Chang | H01L 21/68721 | 111/183 |
| 2007/0116873 A1* | 5/2007 | Li | C23C 16/4401 | 427/248.1 |
| 2008/0141942 A1* | 6/2008 | Brown | C23C 14/564 | 118/723 R |
| 2009/0179085 A1* | 7/2009 | Carducci | C23C 16/4412 | 239/289 |
| 2009/0188625 A1* | 7/2009 | Carducci | H01J 37/32467 | 156/345.34 |
| 2009/0238971 A1* | 9/2009 | Higashi | C23C 16/4401 | 427/255.5 |
| 2009/0239362 A1* | 9/2009 | Hirata | C23C 16/45591 | 438/509 |
| 2010/0032097 A1* | 2/2010 | Ohashi | H01L 21/67034 | 156/345.55 |
| 2011/0168673 A1* | 7/2011 | Nishimoto | H01J 37/32192 | 216/67 |
| 2012/0000886 A1* | 1/2012 | Honda | H01J 37/18 | 216/24 |
| 2012/0009765 A1* | 1/2012 | Olgado | C23C 16/45508 | 438/478 |
| 2012/0273130 A1* | 11/2012 | Drewery | H01J 37/32651 | 156/345.3 |
| 2012/0304922 A1* | 12/2012 | Cheng | H01J 37/3288 | 118/70 |
| 2013/0087286 A1* | 4/2013 | Carducci | H05H 1/46 | 156/345.43 |
| 2013/0264015 A1* | 10/2013 | Fang | H01J 37/32642 | 156/345.48 |
| 2014/0190405 A1* | 7/2014 | Chang | C23C 16/4407 | 118/70 |
| 2015/0187545 A1* | 7/2015 | Lee | H01J 37/32834 | 216/67 |
| 2015/0380216 A1* | 12/2015 | Jang | H01J 37/32477 | 156/345.41 |
| 2016/0160349 A1* | 6/2016 | Cho | C23C 16/4412 | 438/22 |
| 2016/0312360 A1* | 10/2016 | Rasheed | C23C 16/45544 | |

\* cited by examiner

CHEMICAL VAPOR DEPOSITION APPARATUS AND ITS CLEANING METHOD

RELATED APPLICATION

This application claims priority benefit from Chinese Application, Serial Number 201510218357.1, filed on Apr. 30, 2015, the entire content of which is incorporated herein by reference.

TECHNICAL FIELD

The invention relates to the vapor deposition and manufacturing technology field, especially to a metal organic chemical vapor deposition reactor with auto cleaning device and function of self cleaning.

BACKGROUND

As shown in FIG. 1, a metal organic chemical vapor deposition (MOCVD) reactor includes a reaction chamber 100, in which there is a tray 14 and several substrates 15 to be processed are fixed on the tray 14. There is a rotation shaft 24 at the center below the tray 14, driving the tray 14 at high speed during the reaction. There is a heater 12 below the tray 14, which heats the tray 14 to appropriate high temperature that is about 1000° C. normally to facilitate the crystallization of the GaN crystalline material. A gas showerhead 21 is positioned opposite to the tray 14 in the reaction chamber 100. The gas showerhead 21 includes multiple gas inlet channels that are separated. The first group of gas channels is connected to the first reaction gas source 41 through gas pipeline 43. The second group of gas channels is connected to the second gas source 42 through the second gas pipeline 44. In the gas showerhead 21, the third group of gas channels can be set between the first and second groups of channels to isolate different reaction gases. The lower part of the gas showerhead 21 further includes cooling liquid pipeline that is connected to the cooling liquid source 50 through the cooling liquid supply pipeline 51. The temperature of the gas showerhead can be controlled by controlling the temperature and flow rate of the cooling liquid outputted from the cooling liquid source, such as 50° C. A reactor liner 62 is positioned surrounding the reaction space between the gas showerhead and the tray. The upper part of the liner 62 further includes a driving mechanism 64 which is used to drive the liner 62 to move up and down. When the liner 62 is at a higher position, it can shield the tray entry port (not shown in the figure) on the sidewall of the reaction chamber 100, so as to reduce the non-uniformity caused by the tray entry port and improve the uniformity of the gas flow and temperature. When the process on the tray is completed, the tray will be removed out of the reaction chamber. The liner 62 is driven to move downward so as to make the tray 14 pass through the tray entry port on the sidewall 100. A base is set below the tray 14. The base further includes a sidewall 16 which surrounds the rotation shaft 24 and the heater 12 so as to shield the heat inside the base and the contaminants outside the base. The lower part of the reaction chamber further includes an exhaust area 34. The by-products and waste gases after the reaction will be delivered to the gas pump 36 through pipelines to discharge the by-products and waste gases from the reaction chamber and to control the gas flow and pressure in the reaction chamber. There is a ring shaped gas baffle 30 horizontally set between the exhaust area 34 and the reaction area. The inner side of the gas baffle 30 is fixed on the outer side of the base, and the other side is fixed on the inner wall of the reaction chamber 100. There are one or more gas openings 31 on the ring gas baffle 30, which can be annular grooves or gas holes uniformly distributed on the ring shaped gas baffle 30. The flow rate and distributions of the gases in the reaction area can be controlled by setting the size of the gas openings 31. The cooling liquid supply system 51 can also supply cooling liquid to the liner 62 and the sidewall of the reaction chamber 100 to control the temperature of such components.

In the prior art, during the reaction, the reaction gases will produce GaN or other nitrides, meanwhile, the reaction gas trimethylgallium (TMG) will produce a great amount of organic matters at high temperature. Such solid products can form compact semiconductor crystals on the tray 14 and substrate 15 at high temperature, but loose depositions will deposit on the reactor components with low temperature such as the liner 62, the inner wall of the reaction chamber 100 or the gas showerhead 21, which may form flaky contaminants or depositions after a long time. These flaky contaminants or depositions will peel off and then fall onto the gas baffle 30 down below. Some flaky contaminants with large sizes will block the gas openings 31. Once the exhaust ports 31 are blocked, the distribution of the reaction gases will not be uniform and the structure of the crystals grown on the substrates will not be uniform, which will significantly influence the productivity and quality of the LED substrates.

To solve the above problems, the power must be turned off and the reaction chamber must be opened frequently to clean the depositions on the gas baffle 30, which may influence the productivity of the CVD apparatus. One of the prior arts discloses that a cleaning device can be installed on the liner 62. A cleaning apparatus is connected with and driven by the liner 62 to pass through the gas openings to break the depositions when the liner 62 is moving downward. However, such design also has disadvantages, since the liner 62 can only move up and down for one time after the completion of the whole reaction procedure and the duration of the reaction may be as long as several or dozens of hours, during such long procedure the opening 31 may be blocked and the opening can't be unblocked instantly. This design cannot solve such problem. Therefore, a better cleaning device or cleaning method is required to ensure the long-term and effective cleaning of the exhaust ports of the CVD apparatus.

SUMMARY

The problem solved by the invention is the cleaning of the exhaust area of the CVD apparatus to prevent the blockage of the exhaust ports by the containments that may lead to the uneven distribution of the gas.

According to the purpose of the invention, the present application has provided a chemical vapor deposition (CVD) device, includes:

a reaction chamber including a sidewall;

a base in the reaction chamber. The base includes base sidewall and there is an exhaust area between the base sidewall and the reaction chamber sidewall;

a device dividing the exhaust area into an exhaust chamber and a storage surrounding the base sidewall. The storage chamber is connected to the reaction area above the base;

the device includes a sidewall, and plurality of exhaust ports are set on the sidewall of the device, which connect the exhaust chamber and the storage chamber;

wherein the exhaust ports are used to let the reaction gases and by-products during the reaction chamber process into the exhaust chamber. The exhaust chamber is used to discharge the reaction chamber and by-products to the outside of the reaction chamber. The storage chamber is used to collect the granulated or flaky depositions during the process.

The present application further provides a processing method for the CVD apparatus, including:

inject reaction gases into the reaction chamber to conduct chemical vapor deposition on the base. During the process, the reaction gases and by-products in the reaction area will be discharged into the exhaust chamber through the exhaust ports along the vertical routes, which will be discharged to outside, and the granulated or flaky depositions will be collected into the storage chamber.

The invention further provides a chemical vapor deposition (CVD) device, including:

a reaction chamber including a sidewall;

a base in the reaction chamber. The base includes base sidewall and there is an exhaust area between the base sidewall and the reaction chamber sidewall;

a device dividing the exhaust area into an exhaust chamber and a storage surrounding the base sidewall. The storage chamber is connected to the reaction area above the base;

the device includes a sidewall, and plurality of exhaust ports are set on the sidewall of the device, which connect the exhaust chamber and the storage chamber;

the exhaust area includes at least one movable scraping component that can move at the exhaust ports.

The invention provides a chemical vapor deposition (CVD) device, including: a reaction chamber containing a gas inlet on the top of the chamber, and a base under the gas inlet. The base includes a sidewall and there is an exhaust area between the base sidewall and the reaction chamber sidewall, a device dividing the exhaust area into an exhaust chamber and a storage surrounding the base sidewall in an inside and outside configuration. The storage chamber is connected to the reaction area above the base. The device includes a sidewall, and plurality of exhaust ports are set on the sidewall of the device, which connect the exhaust chamber and the storage chamber. The exhaust area includes at least one movable scraping component that can move at the exhaust ports. The exhaust chamber can be on the inner side and the storage chamber is on the outer side. The device further includes a cover on the top which is on the exhaust chamber to prevent the depositions from falling into the exhaust chamber. The top cover has an inclining upper surface with the shape that can fit with the inner surface of the lining, which can crush the large depositions on the upper surface of the cover.

The base sidewall is surrounding a heating device and a rotation shaft. There is a tray above the rotation shaft. A movable liner is surrounding the reaction area above the base. The liner can drive the scraping component to move between the upper and lower ends of the opening. The scraping component is connected to the liner through a connection rod. The exhaust area further includes a lever. The scraping component is connected to the first end of the lever, and the second end of the lever is connected to the liner. The exhaust are further includes a lifting rod. The first end of the lever will lift the scraping component through the lifting rod and the supporting point of the lever is below the lower end of the vent, which can avoid the interference on the gas through the vent. The bottom of the storage area further includes a separation board and the lever is below the separation board.

Alternatively, the lifting rod is moving up and down along the inner sidewall of isolating device, and the scraping component is moving between the upper and lower ends of the opening along the inner side of the device. Or the scraping component can be in the storage chamber and move between the upper and lower ends of the opening along the sidewall of the device.

Alternatively, several scraping components can be used among plurality of exhaust ports to drive them to make circling motion along the sidewall of the device to ensure that each scraping component can sweep at least one vent area.

Wherein the storage chamber includes at least one device preventing depositions and the device preventing depositions includes a plate inclining downward.

Further the scraping component in the invention has an extension part expanding horizontally, which may expand into the exhaust ports when the scraping components passing through the exhaust ports.

The present application further provides a method to clean the CVD apparatus, including:

moving the scraping component nearby the exhaust ports to scrap the depositions on the exhaust ports.

Alternatively, the movable liner in the reaction chamber shall be moved up and down to drive the scraping component move up and down.

Alternatively, the movable liner and the scraping component can realize the linkage through the connection rod or lever.

Alternatively, the scraping component shall be driven to make circling motion surrounding the device to make each scraping component at least sweep through part of the vent area.

Alternatively, the first position and the second position are at the upper and lower ends of the vent, respectively, or between different exhaust ports.

DETAILED DESCRIPTION

The invention relates to solve the blockage issue of the exhaust ports of the exhaust area by the contaminants produced during the process operation of a CVD apparatus, leading to the uneven gas distribution of the reaction gases.

Figure 1:
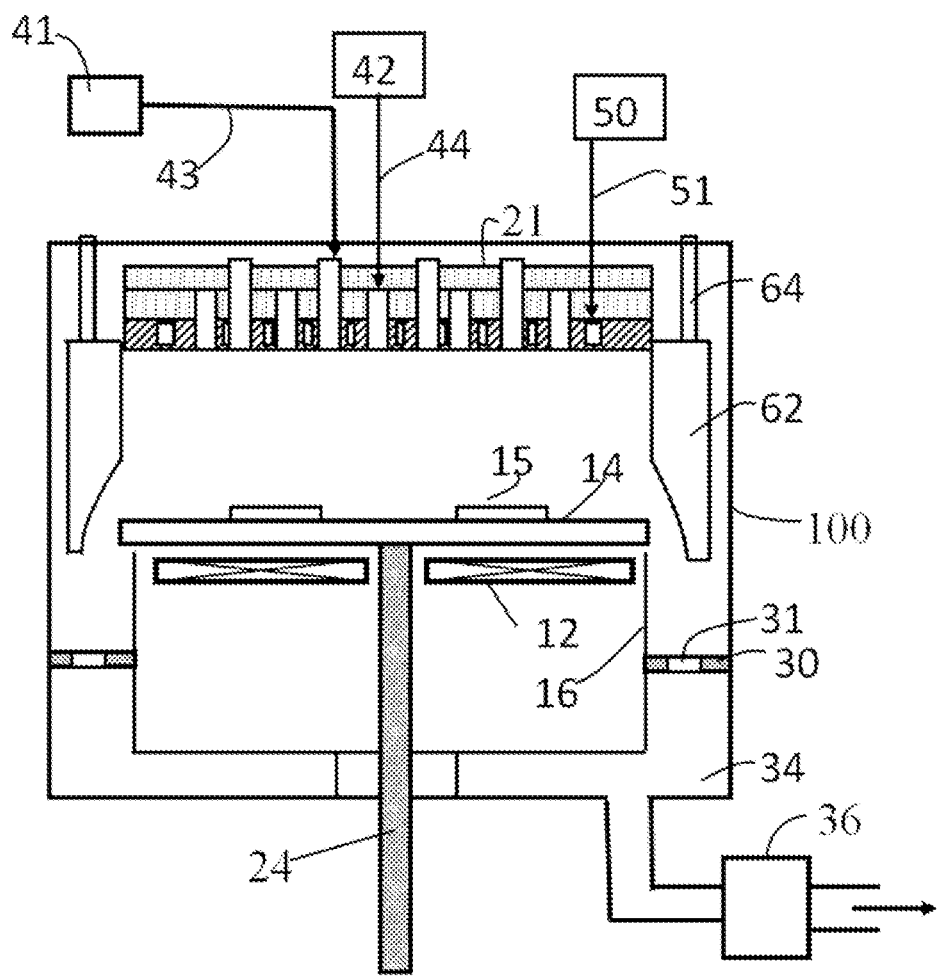
FIG. 1 is a schematic diagram of an overall structure of a CVD apparatus of the prior art.

As shown in FIG. 1, in the CVD apparatus, big flake-like depositions peeling off from the above in the reactor fall onto the gas baffle 30 down below and block the gas exhaust openings 31, leading to non-uniformity of the processing results. To solve this problem, the present invention provides a unique, simpler and more effective solution. Different from the prior arts, the present invention provides a lateral exhaust apparatus in the CVD apparatus in which the opening orientation of the exhaust ports is not vertical (such as in the horizontal direction). In this way, the granulated or flaky depositions during the process can be effectively avoided from falling into and blocking the exhaust ports. Meanwhile, a deposition storage chamber that is isolated from the exhaust chamber is provided in the exhaust area, which can effectively collect and compact the granulated or flaky depositions therein. Therefore, granulated depositions will not flow randomly in the reaction chamber and influence the gas exhausting and uniformity of the processing.

Figure 2:
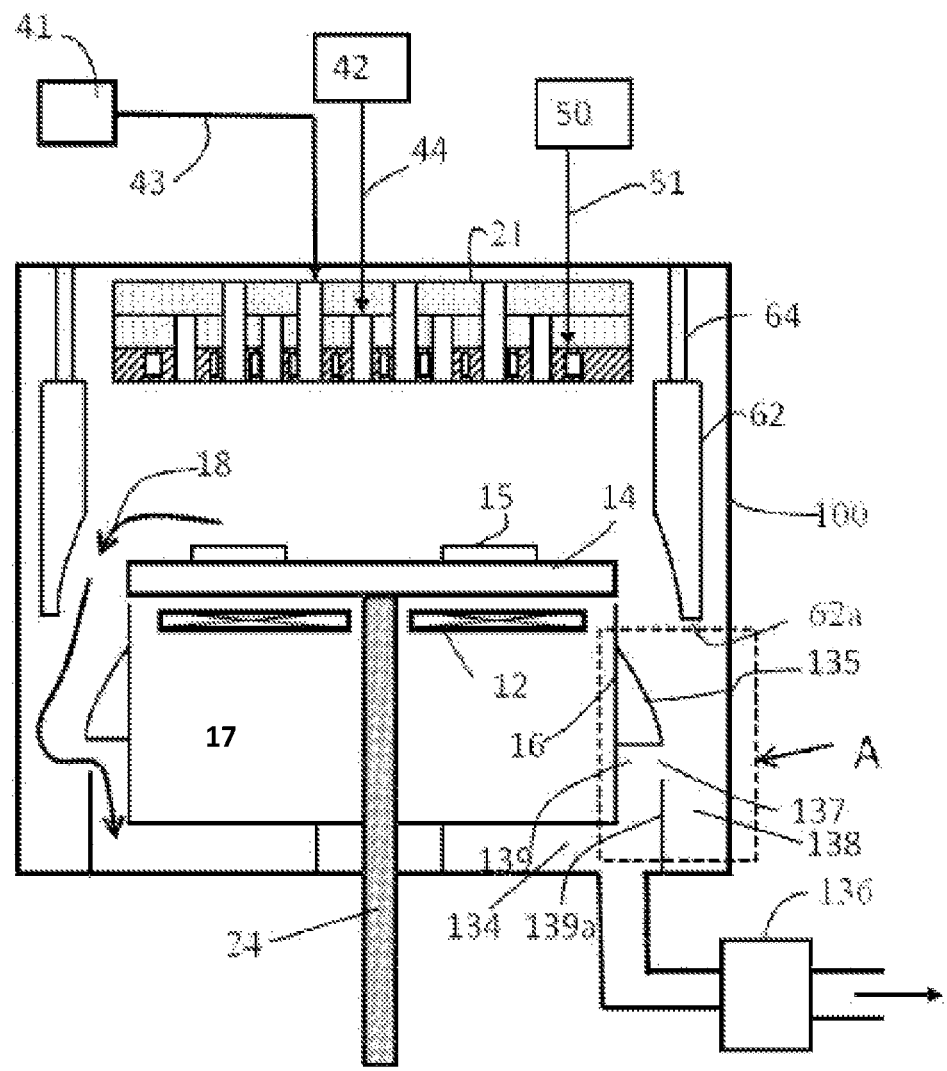
FIG. 2 is a schematic diagram of one embodiment of a CVD apparatus of the present invention.
Figure 3:
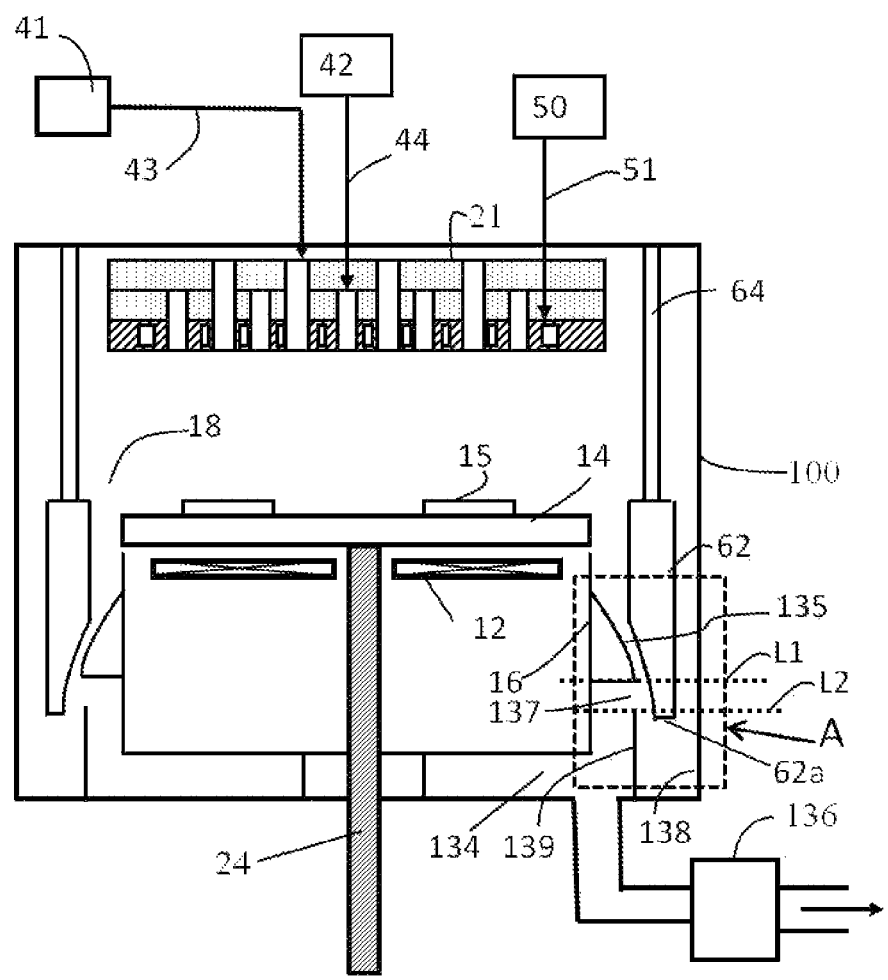
FIG. 3 is a schematic diagram showing another status of the CVD apparatus shown in FIG. 2.

The invention is illustrated with the embodiments shown in FIG. 2 and FIG. 3. FIG. 2 depicts an embodiment of the CVD apparatus of the present invention. FIG. 2 shows the status during the chemical vapor deposition of the reactor wherein the movable liner 62 is in an upper position. The basic structure of the reactor of the invention is basically the same as that of the prior art shown in FIG. 1. The major difference or improvement is at the exhaust area positioned between the sidewall 16 of the base 17 and the sidewall of the reaction chamber (shown as the dotted line box A). In the invention, the exhaust area down below the reactor includes an isolating device 139 which divides the exhaust area into an exhaust chamber 134 and a storage area or a storage chamber 138 for collecting depositions, in which the exhaust chamber 134 is in the inside position and the storage chamber 138 surrounds the periphery of the exhaust chamber 134. As an embodiment, the isolating device 139 is a cylindrical isolating plate 139 having a top cover (see below for details). The isolating device 139 includes a sidewall 139a and a plurality of exhaust ports 137 are allocated on the sidewall 139a. The exhaust chamber 134 is positioned on the inside of the sidewall 139a of the isolating device 139 and is set surrounding the periphery of the sidewall 16 of the base 17.

The isolating device 139 further includes a top cover 135 which is configured above the exhaust chamber 134. The inner side of the top cover 135 is fixed onto the outer side of the sidewall 16 of the base. There are one or more openings 137 with non vertical opening orientation configured on between low surface of the top cover 135 and the isolating device sidewall 139a. The openings 137 function as the exhaust ports to allow the reaction gases to enter into the exhaust chamber 134 along the exhaust gas path with the numeral 18 as shown in FIG. 2 and then to be exhausted by a gas exhaust pump 136. Meanwhile, the small granulated contaminants produced in the processing are exhausted. The big flaky depositions or larger granulated depositions peeling off from the movable liner 62 or the gas showerhead above will fall into the storage area or storage chamber 138 vertically due to the action of the gravity, and will not pass horizontally through the exhaust ports 137 and then enter the exhaust chamber 134 or directly block the exhaust ports 137. As long as the volume of the storage chamber 138 is large enough, the depositions produced in several crystal growth procedure cycles (such as more than 100) can be stored in it, therefore, it is unnecessary to open the reaction chamber for chamber cleaning or adopt mechanical structure to scrape frequently the gas openings 31 (shown in FIG. 1) to ensure the gas openings keep unblocked.

According to the above description, in the reaction chamber of the CVD apparatus of the invention, an isolating device with side exhausting function is installed in the exhaust area between the sidewall of the base and the sidewall of the reaction chamber. The isolating device divides the exhaust area into an exhaust chamber and a storage chamber which surrounds the sidewall of the base with an internal and external arrangement. The storage chamber is fluidly connected to the reaction area above the base. The isolating device includes a sidewall and a plurality of exhaust ports are set on the sidewall. The exhaust chamber and the storage chamber are connected through the exhaust ports. During the processing of the reaction chamber, the reaction gases and by-products are discharged from the reaction area via the exhaust ports. The granulated or flaky depositions fall into and will be collected in the storage chamber. The exhaust ports are used to let the reaction gases and by products flow into the exhaust chamber and then discharge the reaction gases and by-products to the outside of the reaction chamber. The storage chamber is used to collect the granulated or flaky depositions during the processing.

Preferably, the opening orientation of the plurality of exhaust ports is not in the vertical direction (such as, in the horizontal direction or in the inclining direction less than 90 degree to the horizontal direction) to prevent the granulated or flaky depositions during the processing from falling into and blocking the exhaust ports.

Preferably, one top cover is positioned above the plurality of exhaust ports which provides the exhaust ports with shelter to prevent the granulated or flaky depositions from falling into and blocking the exhaust ports.

FIG. 3 depicts the movable liner shown in FIG. 2 is at a lower position in the reaction chamber. At this position, the processing in the reaction chamber is stopped, and the tray 14 can be transferred out and in through the tray entry port on the sidewall 100. The movable liner 62 is set surrounding the reaction area and can move up and down along the sidewall of the reaction chamber. The movable liner includes a bottom end surface 62a. In FIG. 3, each of the plurality of exhaust ports 137 has an opening starting line L1 on upper part and the opening ending line L2 on lower part. When the movable liner 62 moves to a lower position, the bottom end surface 62a of the movable liner passes the opening starting line L1, and further scraps the big sediment particles or flaky depositions near the exhaust ports 137, and stops at a position below the opening starting line L1. More preferably, when the liner moves to the lower position, the bottom end surface 62a passes the opening ending line L2 and stops at a position below the opening ending line L2. At this position, the bottom end surface 62a can not only fully scrap the large sediment particles or flaky depositions near the exhaust ports 137 but press and compact the depositions stored in the storage chamber 138.

The top cover 135 of the isolating device has an inclining surface and the shape of the inclining surface matches with the inner surface of the movable liner 62. When the movable liner 62 is moving up and down, the inner surface of the liner 62 will not crush with the upper surface of the top cover 135.

Further, at least one deposition backflow preventing device is further installed in the storage chamber 138, which includes plates inclining downward.

Figure 10:
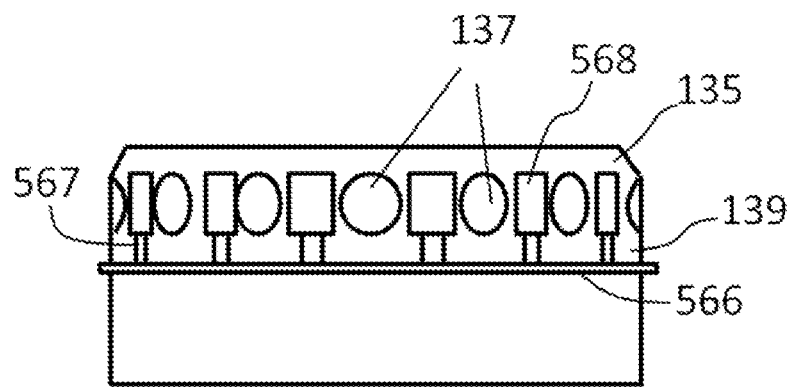
FIG. 10 is a side view of an isolating device in another embodiment of the present invention.

Further, as shown in FIG. 10, a rotation ring 566 is set on the outer sidewall of the device. There are several extending parts 567 set on the rotation ring 566, and there are scraping components 568 set on the upper parts of the extending parts. The rotation ring 566 rotates along the outer sidewall of the isolating device to drive the scraping components 568 to scrap among different exhaust ports 137.

To effectively prevent or remove the large depositions that may block the exhaust ports 137, various embodiments as follows in the present application can realize this aim.

Figure 4:
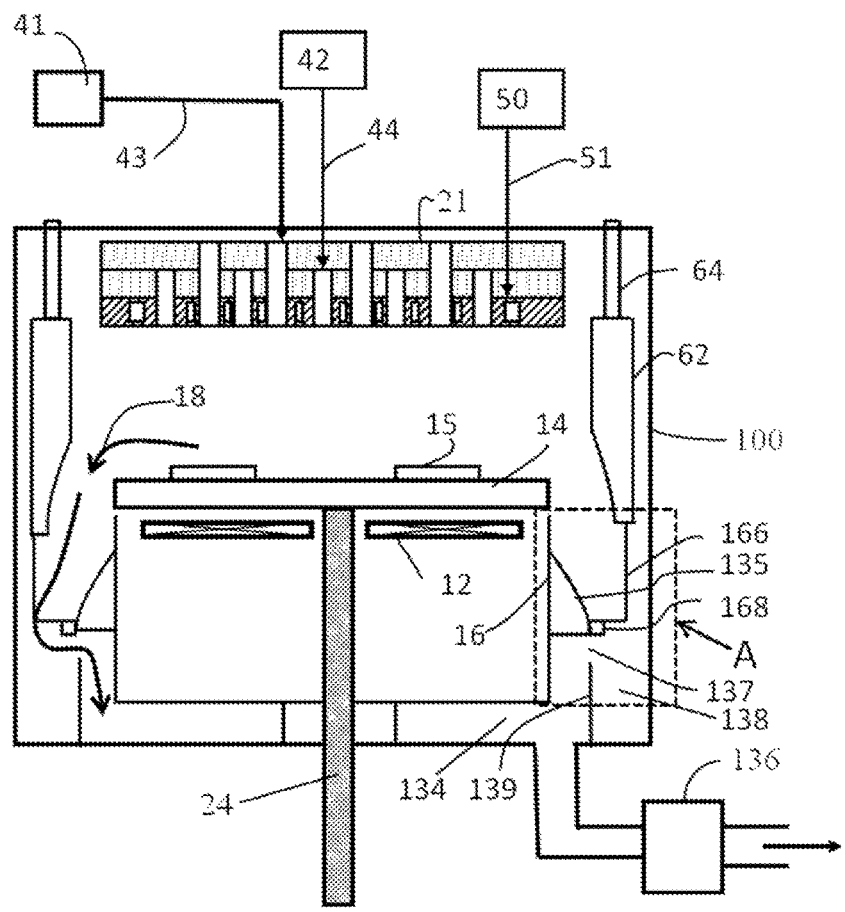
FIG. 4 is a schematic diagram of another embodiment of a CVD apparatus of the present invention.

As shown in FIG. 4, the present invention provides a CVD apparatus and the basic structure of the reactor is substantially the same as that of the prior art shown in FIG. 1. The major improvement is at the exhaust area between the sidewall of the base and the sidewall of the reaction chamber (see the dotted line box A). In the invention, the exhaust area includes a cylindrical isolating device 139 which divides the exhaust area into an exhaust chamber 134 (on the inside) and a storage area or storage chamber 138 (on the outside) surrounding the exhaust chamber to store the depositions. Above the exhaust chamber, there is a ring-shaped cover 135 whose inside is fixed onto the outer side of the sidewall 16 of the base. There are one or more openings 137 set between the bottom surface of the cover 135 and the isolating device 139, which function as exhaust ports to make the reaction gas flow into the exhaust chamber 134 along the gas path 18 and being exhausted by the gas pump 136. Meanwhile, the small granulated contaminants are further taken away with the gas flow. The large depositions peeled off from the liner 62 fall vertically into the storage area 138 due to the action of the gravity, therefore they do not pass horizontally through the exhaust ports 137 and block the exhaust ports 137. If the volume of the storage chamber 138 is large enough, the depositions produced in several crystal growth procedure cycles (such as more than 100) can be stored, it's unnecessary to open the reaction chamber for chamber cleaning or to use mechanical structures to scrap frequently or pass through the horizontal openings so as to ensure the openings unblocked, as described in FIG. 1.

In the CVD apparatus of the invention, depositions only accumulate on the top surface of the cover 135 and the outside of the isolating device 139. During long-term operation, these depositions will further expand to the exhaust ports 137 and influence the distribution of gas flow. Therefore, they shall be cleaned after a time interval. However, since most large depositions will fall into the storage chamber, the cleaning frequency can be very low while it can ensure the gas flow stable during a complete growth process cycle. The cleaning can be conducted when the substrate is delivered out from the reaction chamber.

The bottom end surface of the movable liner 62 in FIG. 4 includes a connection rod 166 extending downward. One end of the connection rod 166 is fixed on the liner, and the other end is connected to a scraping component 168. The shape and structure of the connection rod 166 can be made so that the scraping component 168 is attached to the outer side of the top cover 135 above the exhaust ports 137.

Figures 5A, 5B:
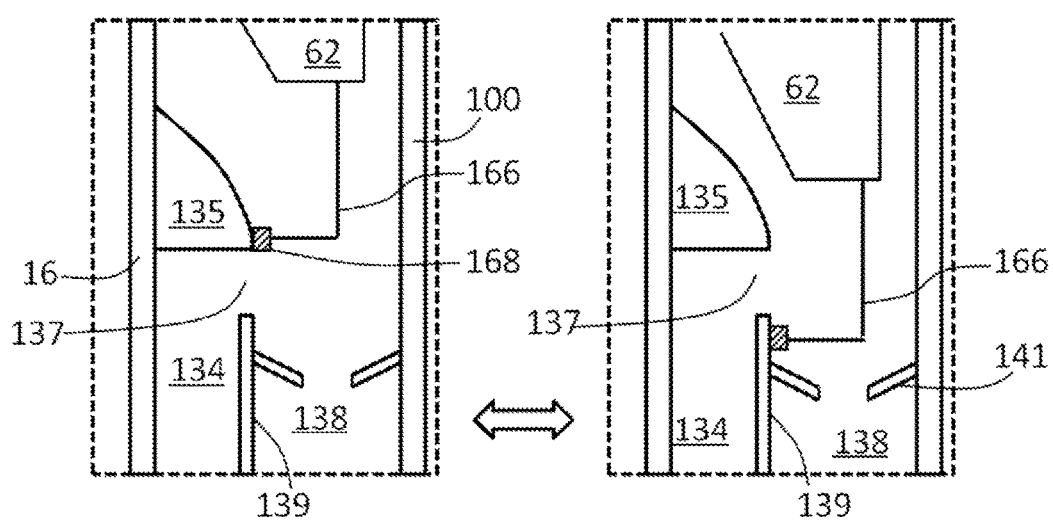
FIGS. 5a and 5b are enlarged schematic diagrams of the exhaust area in one embodiment of the present invention.

FIGS. 5a and 5b are the enlarged diagrams of the structure of the exhaust area as shown in the dotted line box A of FIG. 4. FIG. 5a is the status showing the movable liner 62 at a high position during the crystal growth. FIG. 5b shows the moment that the tray is delivered out from the reaction chamber and the door on the sidewall of the reaction chamber is opened after the completion of the crystal growth, and the liner is moved down to a certain height. Under this circumstance, the scraping component moves along with the liner and moves to outer side of the isolating device 139. During each crystal growth procedure, the scraping component moves to-and-fro across the exhaust ports 137 for one time to ensure that the exhaust ports 137 are not blocked.

Figures 6A, 6B:
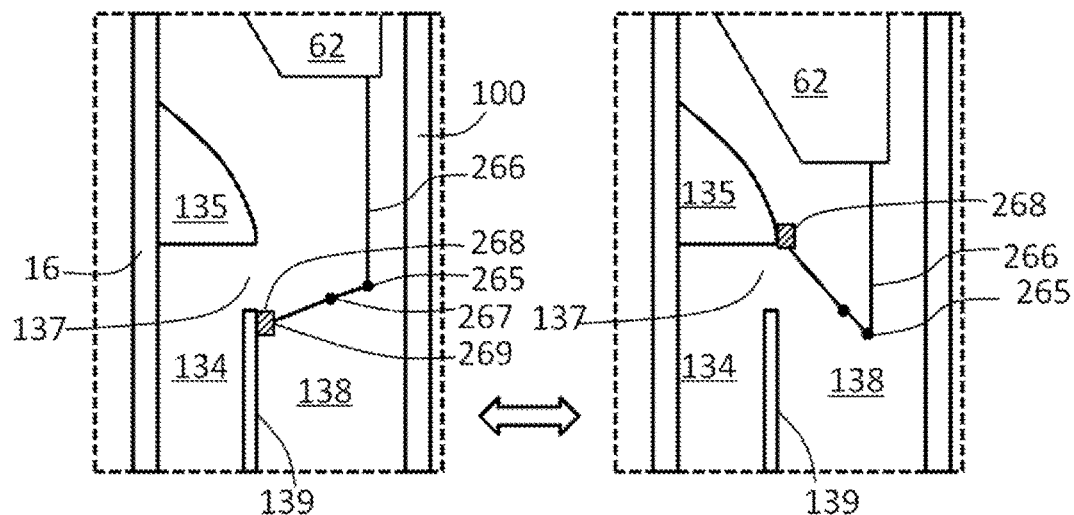
FIGS. 6a and 6b are enlarged schematic diagrams of the exhaust area in another embodiment of the present invention.

In the embodiment shown in FIGS. 5a and 5b, since the connection rod 166 and the scraping structure traverse the venting gas exhaust path 18, they will influence the gas flow. FIGS. 6a and 6b provide another embodiment which shows an enlarged diagram of another embodiment of an exhaust area. FIG. 4a shows the diagram when the crystal growth procedure is going on. The bottom end surface of the liner 62 is fixed with a connection rod 266, and its lower end extending downward is connected to the first end 265 of a lever. The lever includes a supporting point 267 and the second 269. The second end 269 of the lever is connected to the scraping component 268. Similarly, as can be seen in FIG. 6b, after the completion of one crystal growth procedure, the movable liner 62 is lowered down, the rod 266 moves downward to drive the first end 265 of the lever to move downward. At the same time, the second end of the lever takes the scraping component 268 to the top end of the exhaust ports 137. In this way, the lever structure can further clean the exhaust ports 137 by removing the contaminants attached on the surface. The lever supporting point 267 can be fixed on the sidewall 100 of the reaction chamber or the plate 139 or other components of the reaction chamber. If the supporting point of the lever fulcrum is not lower than the positions of the exhaust ports 137, the lever will not be blocked by the many depositions accumulated in the storage chamber 138, therefore not impacting the movement of the scraping component 268.

Figures 7A, 7B:
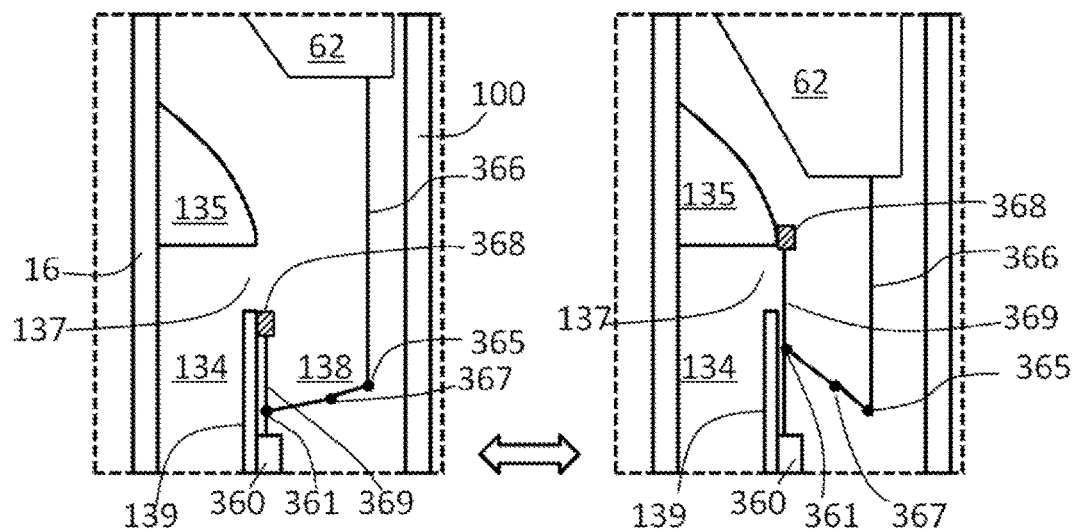
FIGS. 7a and 7b are enlarged schematic diagrams of the exhaust area in another embodiment of the present invention.

In the embodiment shown in FIGS. 6a and 6b, since the connection rod 266 and the lever are on the venting gas exhaust path 18, they will influence the gas flow. The invention provides another embodiment of the exhaust area as shown in FIG. 7a and FIG. 7b, wherein FIG. 7a shows the diagram when the crystal growth procedure is going on. The lower end of the movable liner 62 is fixed with a connection rod 366, and the downward extending lower end of the connection rod 366 is connected to the first end 365 of a lever which includes the supporting point 367 and the second end 361 of the lever, and the second end 36 is connected to a lifting rod 369. The top end of the lifting rod 369 is fixed with a scraping component 368, and the bottom end of the lifting rod 369 is connected to a pull-down component 360 which can be a counter weight or a spring or a/gas spring. Similarly, as can be seen in FIG. 7b, after the completion of a crystal growth procedure, the movable liner 62 is lowered down, and the connection rod 366 will moves downward to drive the first end 365 of the lever to move downward. Meanwhile, the second end of the lever will takes the lifting rod 369 and the scraping component 368 fixed on the top end of the lifting rod 369 to the upper end of the exhaust ports 137. Such lever structure can clean the exhaust ports 137 by removing the contaminants attached on the surfaces of the exhaust ports 137. Since the height of the lever is below the lower end of the exhaust ports 137 first vent 137, it will not influence the gas flow during the crystal growth procedure.

Figure 8:
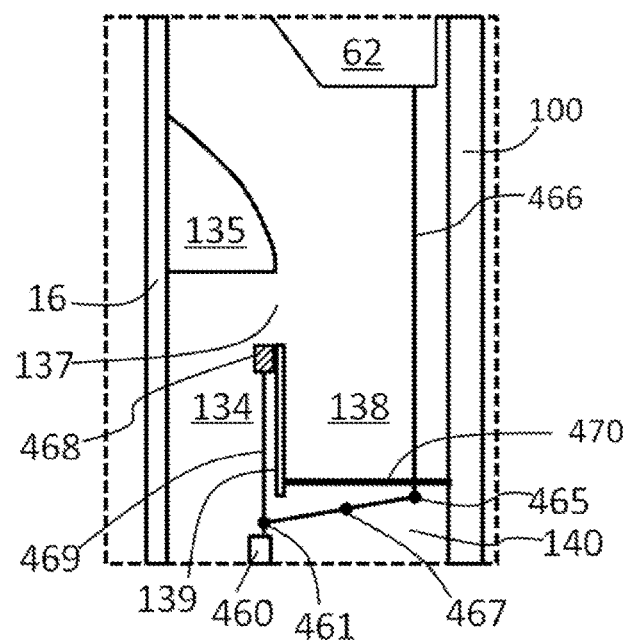
FIG. 8 is the enlarged schematic diagram of the exhaust area in another embodiment of the present invention.

To prevent the lever and lifting rod from to being buried by the accumulated depositions, the invention can further be changed to another embodiment as shown in FIG. 8. As can be seen in FIG. 8, a horizontal partition plate 470 is installed in the storage chamber to divide the storage chamber into the upper sub-chamber 138 and the lower sub-chamber parts 138 and 140. The upper sub-chamber 138 is further used to store depositions and the lower sub-chamber 140 is used to accommodate contain the lever. Only the connection rod 466 is passing through the hole on the partition plate 470 and can move up and down between the two sub-chambers. The other lever components 460, 461, 467 and 465 have the same functions as the components 360, 361, 367 and 365. Since the connection rod 466 is moving moves vertically, and it can move forward and backward after each cycle of the crystal growth procedure, the connection rod 466 two rods will not be blocked by the accumulated depositions. Since the horizontal lever is located in the lower sub-chamber 140, few depositions can pass through the hole on the partition plate 470 and they will not influence the movement of the lever. Such structure can make the scraping component 468 clean the inner surface of the isolating plate 139. The lever in the invention can include several lifting rods to push several scraping components to move up and down and remove the depositions on both sides of the isolating plate 139 at the exhaust ports 137.

Further, if the isolating plate 139 is thick enough and the isolating plate contains a space in which scraping component or lifting rods can be installed, the lifting rods 469 can be installed in the isolating plate 139 and can move up and down to drive the scraping component move between the both ends of the exhaust ports 137.

The scraping component in the invention can remove the depositions accumulated on the exhaust ports 137 in up and down direction, it can also move in other directions for cleaning FIG. 10 is another embodiment of the invention. The side view of the isolating plate 139 is shown in the figure. The major difference of this embodiment from the previous embodiments is that a rotation ring 566 is installed at the outer wall of the isolating plate 139. The rotation ring 566 has several extension parts 567 extending upward. The scraping components 568 are installed on the upper end of the extension parts 567 and several scraping components 568 are set between different exhaust ports 137. When a driving device drives the rotation ring 566 to move around the isolating plate 139, the scraping components 568 pass the exhaust ports 137 and finally stop at the position between the exhaust ports 137. The scraping components 568 and the driving device of this embodiment are set below the gas channel to prevent the influence on the gas flow pattern during the crystal growth procedure.

The storage area 138 of the invention can also be set nearby the base sidewall 16, and the exhaust chamber 134 can be set nearby the reaction chamber sidewall 100 to form a structure that the exhaust chamber surrounds the storage area. In this case, the shape of the top cover 135 of the exhaust chamber shall be corrected, and the inclining direction of the top cover 135 shall be opposite to that of the previous embodiments. Its inclining direction is inclining from the outside to the inside. Such structure can realize the purpose of the invention and belongs to the same invention idea.

Figures 9A, 9B:
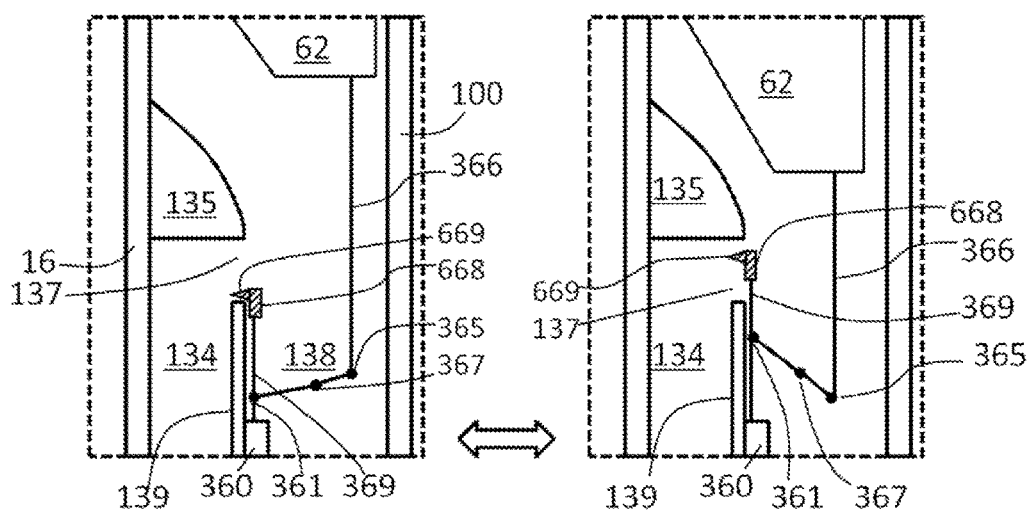
FIGS. 9a and 9b are enlarged schematic diagrams of the exhaust area in another embodiment of the present invention.

The scraping components in the invention besides that as shown in FIGS. 5-8 can be the overall steel plates extending vertically in previous embodiments. They can further include horizontal extension parts which can extend into the exhaust ports 137 when the scraping components are passing through the exhaust ports 137. In this way, the inside and the outside surfaces of the exhaust ports 137 can be cleaned at the same time. FIGS. 9a and 9b shows another embodiment of the invention, and the structure is basically the same as the embodiment shown in FIGS. 7a and 7b. The major difference is that the scraping components include the scraping plate 668 and the horizontal extension parts 669. When the scraping component shown in FIG. 9a is contacting with the plate 139, the extension parts 669 is at the bottom of the exhaust ports. When the scraping component shown in FIG. 9b is passing through the exhaust ports 137, the extension parts 669 will get into the exhaust ports to clean the inside of the exhaust ports 137. The extension parts 669 can be mechanical structure with any shapes that are not limited to the specific shapes shown in FIGS. 9a and 9b. As long as they can get into the exhaust ports 137, the purpose of the invention can be realized.

In the storage area 138 of the embodiments of the invention, a device preventing the backflow of the depositions deposition backflow preventing device can be installed. As can be seen in FIGS. 5a and 5b, 141 is the device preventing the backflow of the depositions deposition backflow preventing device 141, which can be one or more plates with one end fixed on the isolation plate 139 or the inner wall of the reaction chamber and with the other end leaning downward. During the operation of the CVD apparatus, the large depositions will fall on the deposition backflow preventing device 141 device preventing backflow and go drop into the storage space. Meanwhile, the splashed particles under deposition backflow preventing device 141 will be blocked by the deposition backflow preventing device 141 to avoid secondary contamination. The deposition backflow preventing device 141 can be fixed in the storage area 138 by welding or by being fixed in the storage area 138 with detachable component.

In the invention, the scraping component 168/268/368 can be driven either by the movable liner or by other mechanical driving device such as cylinder or motor. All of these driving devices can realize the purpose of the invention. When any other mechanical driving devices be adopted, it's unnecessary to wait for the ending of the crystal growth to move down the movable liner. Once the blockage of the exhaust ports 137 is detected, the scraping component can be driven directly by the mechanical driving devices to remove the depositions, which has better flexibility.

The isolating plate or isolating device 139 dividing the exhaust chamber and storage area in the invention can be set vertically. They can also be set inclining to inside or outside. As long as the large depositions can not fall into the exhaust ports on the isolating plate 139 to block the exhaust ports, the purpose of the invention can be achieved.

Figure 11A:
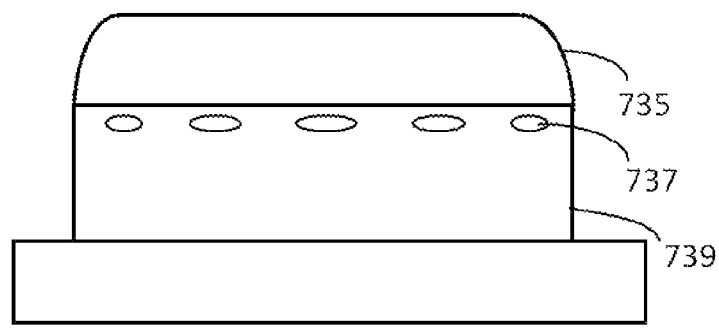
FIGS. 11a and 11b are the diagrams of the exhaust apparatus or device of the present invention.
Figure 11B:
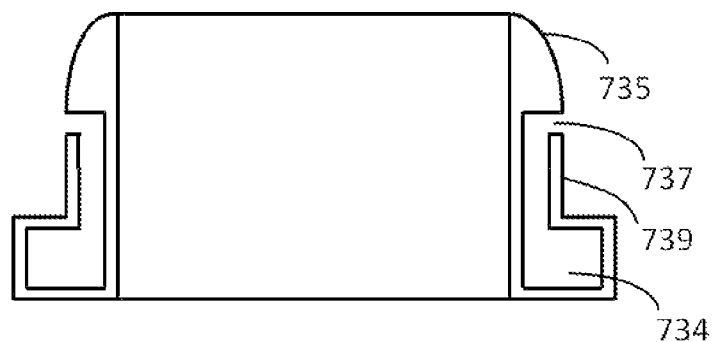

As an embodiment, FIG. 11a, FIG. 11b respectively shows the front view of the exhaust apparatus or the isolating device of the invention and FIG. 11b shows the section view of the exhaust apparatus or the isolating device of the invention. The exhaust apparatus or the isolating device is in a cylinder structure, including the top cover 735, sidewall of 739, exhaust chamber 734 and the exhaust ports 737. The exhaust chamber 734 is connected to the exhaust pump (not shown in the figure). The exhaust ports 737 are set below the top cover 735, and the opening orientation of the exhaust ports is not in the vertical direction (such as in the lateral direction).

In the invention the isolating device is used to vertically divide the exhaust area and form to be the exhaust chamber and the storage area. A lot of depositions will fall into the storage chamber directly, and the gases will flow into the exhaust chamber through the exhaust ports on the sidewall of the isolating device. Such design can ensure that the exhaust ports cannot be blocked by the large depositions. In this way, the exhaust ports will not be blocked in a long time, and the optimized cleaning device will not influence the gas flow pattern during the crystal growth procedure.

Although the invention is disclosed as above, the invention is not limited herein. Any technical personnel in the field can make changes and modifications within the spirit and scope of the invention. Therefore, the protection scope of the invention shall be the scope defined in the claims.

What is claimed is:

1. A chemical vapor deposition apparatus, comprising:
a reaction chamber including a reaction chamber sidewall;
a base positioned in the reaction chamber, wherein the base includes a base sidewall and there is an exhaust area between the base sidewall and the reaction chamber sidewall;
an isolating device dividing the exhaust area into an exhaust chamber and a storage chamber which surround the base sidewall with internal and external arrangement, wherein the storage chamber is connected to a reaction area above the base;
the isolating device including a sidewall, wherein a plurality of exhaust ports are set on the sidewall of the isolating device, and the exhaust chamber is connected to the storage chamber via the plurality of exhaust ports;
wherein the plurality of exhaust ports are configured to allow reaction gases and by-products produced during reaction process of the reaction chamber to flow into the exhaust chamber, the exhaust chamber is configured to discharge the reaction gases and by-products to outside of the reaction chamber, and the storage chamber is configured to collect granulated or flaky depositions during the reaction process; and,
wherein the reaction chamber further includes a movable liner surrounding the reaction area above the base, which moves up and down along the reaction chamber sidewall, and the movable liner includes a bottom end surface, and wherein the storage chamber is positioned below the movable liner such that during processing the movable liner is in up position allowing flaky depositions to fall into and collect in the storage chamber.

2. The apparatus of claim 1, wherein the exhaust chamber is positioned inside of the sidewall of the isolating device and surrounds the outside of the base sidewall, and wherein the storage chamber is positioned outside of the sidewall of the isolating device and surrounds the outside of the exhaust chamber.

3. The apparatus of claim 1, wherein the opening orientation of the plurality of exhaust ports is non vertical direction so as to prevent the granulated or flaky depositions from falling directly into the plurality of exhaust ports and blocking the plurality of exhaust ports.

4. The apparatus of claim 3, wherein the opening orientation of the plurality of exhaust ports is horizontal direction or in an inclining direction less than 90 degree to a horizontal direction.

5. The apparatus of claim 1, wherein the isolating device further includes a cover on the top, which is above the exhaust chamber, to prevent the granulated or flaky depositions from falling into the exhaust chamber.

6. The apparatus of claim 5, wherein the plurality of exhaust ports are positioned below the cover and the cover provides shelter for the plurality of exhaust ports, so as to prevent the granulated or flaky depositions from falling directly into the plurality of exhaust ports along a vertical direction.

7. The apparatus of claim 1, wherein the plurality of exhaust ports have an opening starting line on upper part and an opening ending line on lower part, wherein when the movable liner moves to a lower position, the bottom end surface of the movable liner passes the opening starting line and stops at a position below the opening starting line.

8. The apparatus of claim 7, wherein when the movable liner moves to the lower position, the bottom end surface of the movable liner further passes the opening ending line and stops at a position below the opening ending line, and in this position, depositions stored in the storage chamber are pressed down by the bottom end surface of the movable liner.

9. The apparatus of claim 1, wherein the isolating device further includes a cover above the exhaust chamber, and the cover has an inclining upper surface with a shape that fits with an inner surface of the movable liner, wherein when the movable liner moves up and down, the inner surface of the movable liner does not clash with the inclining upper surface of the cover.

10. The apparatus of claim 1, wherein the storage chamber includes at least one deposition backflow preventing device which includes plates inclining downward.

11. The apparatus of claim 1, wherein the movable liner further includes at least one scraping component which can move nearby the plurality of exhaust ports.

12. The apparatus of claim 1, wherein the scraping component is connected to the movable liner through a connecting rod and the movable liner can drive the scraping component to move between an upper end and a lower end of the plurality of exhaust ports when the movable liner is moving up and down.

13. The apparatus of claim 1, wherein the exhaust area further includes a lever in which a first end of the lever is connected to the scraping component and a second end of the lever is connected to the movable liner.

14. The apparatus of claim 13, wherein the first end of the lever lifts the scraping component via a lifting rod and a supporting point of the lever is lower than the lower end of the plurality of exhaust ports.

15. The apparatus of claim 14, wherein the bottom of the storage area further includes a partition plate and the lever is positioned below the partition plate.

16. The apparatus of claim 11, wherein the scraping component further includes an extension part at least partially extending into the plurality of exhaust ports.

* * * * *